US007192787B2

(12) United States Patent
DeBrosse et al.

(10) Patent No.: US 7,192,787 B2
(45) Date of Patent: Mar. 20, 2007

(54) HIGHLY NONLINEAR MAGNETIC TUNNEL JUNCTIONS FOR DENSE MAGNETIC RANDOM ACCESS MEMORIES

(75) Inventors: John Kenneth DeBrosse, Colchester, VT (US); Yu Lu, Hopewell Junction, NY (US); Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 10/316,141

(22) Filed: Dec. 10, 2002

(65) Prior Publication Data

US 2004/0109347 A1 Jun. 10, 2004

(51) Int. Cl.
*H01L 21/00* (2006.01)

(52) U.S. Cl. .............................. 438/3; 438/38; 257/295; 257/421

(58) Field of Classification Search ................ 257/295, 257/296, 297, 421; 438/3, 38
See application file for complete search history.

(56) References Cited

U.S. PATENT DOCUMENTS

| 5,640,343 | A | 6/1997 | Gallagher et al. ......... 365/171 |
| 6,219,274 | B1 * | 4/2001 | Shimazawa et al. ....... 365/158 |
| 6,574,079 | B2 * | 6/2003 | Sun et al. ................. 360/324.2 |
| 6,756,128 | B2 * | 6/2004 | Carey et al. ................. 428/457 |
| 6,760,201 | B2 * | 7/2004 | Nakashio et al. ........ 360/324.2 |

OTHER PUBLICATIONS

Guth et al., Tunnel magnetoresistance in magnetic tunnel junctions with ZnS barrier, APL, 78(22), p. 3487, May 2001.*
Rottlander et al., Tantalum oxide as an alternative low height tunnel barrier in magnetic junctions, APL, 78(21), p. 3274, May 2001.*

* cited by examiner

*Primary Examiner*—Doug Menz
(74) *Attorney, Agent, or Firm*—Ryan, Mason & Lewis, LLP

(57) ABSTRACT

MRAMs are provided with cells offering low current leakage for partially selected cells. MRAM cells are made with magnetic tunnel junctions having barriers that meet predetermined low barrier heights and predetermined thicknesses. The barrier heights are preferably about 1.5 eV or less. The predetermined thicknesses are calculated to meet power and speed requirements. The predetermined low barrier heights and predetermined thicknesses modify a nonlinear term relating current through to voltage across the magnetic tunnel junction. The modification of the nonlinear term also modifies the amount of current that flows through a magnetic tunnel junction at various voltages. At low voltages, current through the magnetic tunnel junction will be disproportionately lower than current through a conventional magnetic tunnel junction. This decreases leakage current through partially selected MRAM cells and power. At higher voltages, current through the magnetic tunnel junction is adequate for a wide variety of power and speed applications.

23 Claims, 4 Drawing Sheets

HIGHLY NONLINEAR MAGNETIC TUNNEL JUNCTIONS FOR DENSE MAGNETIC RANDOM ACCESS MEMORIES

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

This invention relates to magnetic tunnel junction devices and, more specifically, Magnetic Random Access Memories (MRAMs) containing such devices.

BACKGROUND OF THE INVENTION

An MRAM has many individual cells, each cell comprising a magnetic tunnel junction. During a read operation, certain cells in the MRAM are selected. Other partially selected cells, which are generally the cells on the same bit lines as the selected cells, will have leakage current through them. The higher the leakage current, the harder the task becomes of correctly reading the stored information in the selected cells, causing slower access times. Additionally, high leakage current causes increased power consumption during reads, militating against a major benefit of MRAMs, which is low overall power consumption. Moreover, the relatively high leakage current reduces the attainable size of an MRAM.

There are several techniques available for minimizing leakage current through partially selected cells. However, these techniques have the detriments of increased manufacturing cost and time, larger cell structures, and increased cell complexity.

Consequently, a need exists for reducing leakage current through partially selected MRAM cells without introducing increased manufacturing costs, cell size and complexity.

SUMMARY OF THE INVENTION

Aspects of the present invention overcome problems of the prior art by providing MRAMs with cells offering low leakage current for partially selected cells during a read operation of a selected cell.

In an aspect of the invention, cells for MRAMs are made with magnetic tunnel junctions having barriers that meet predetermined low barrier height and predetermined thickness. The barrier height is preferably about 1.5 eV or less, which is lower than the barrier height used in magnetic tunnel junctions for conventional MRAM cells. The predetermined thickness is calculated to provide certain resistance to meet power and speed requirements, and the predetermined thickness is generally larger than the thickness of barriers for magnetic tunnel junctions used in conventional MRAM cells. The predetermined low barrier height and predetermined thickness modify a nonlinear term relating current through a magnetic tunnel junction to voltage across a magnetic tunnel junction. The modification of the nonlinear term modifies the amount of current that flows through a magnetic tunnel junction at various voltages. At low voltages across the magnetic tunnel junction, which occur primarily when an MRAM cell is partially selected, current through the magnetic tunnel junction will be disproportionally lower than current through a conventional partially selected magnetic tunnel junction. This has the effect of decreasing leakage current through partially selected MRAM cells and, consequently, decreasing power caused by the leakage current. At higher voltages across the magnetic tunnel junction, which occur primarily when an MRAM cell is selected, current through the magnetic tunnel junction is adequate for a wide variety of power and speed applications.

A more complete understanding of the present invention, as well as further features and advantages of the present invention, will be obtained by reference to the following detailed description and drawings.

DETAILED DESCRIPTION OF PREFERRED EMBODIMENTS

The present invention provides MRAMs with lower leakage current. Generally, the tunnel junction barrier for a magnetic tunnel junction made in accordance with the present invention has a decreased barrier height and perhaps greater thickness as compared to normal magnetic tunnel junction barriers. The barrier height and thickness are variables that adjust, as described in more detail below, a nonlinear term relating current through a magnetic tunnel junction to voltage across the magnetic tunnel junction. Adjusting the barrier height and thickness of the barrier adjusts the current leakage through a partially selected MRAM cell while still providing adequate current through a selected cell. The leakage current, because of the changes in the nonlinear term, is disproportionately decreased as compared to leakage current through conventional magnetic tunnel junctions.

The present disclosure is organized as follows. First, descriptions are given of conventional operation of an MRAM and conventional techniques for limiting leakage current for partially selected MRAM cells. Next, aspects of the present invention are described and contrasted with the conventional operation of an MRAM and conventional techniques for limiting leakage current.

Figure 1:
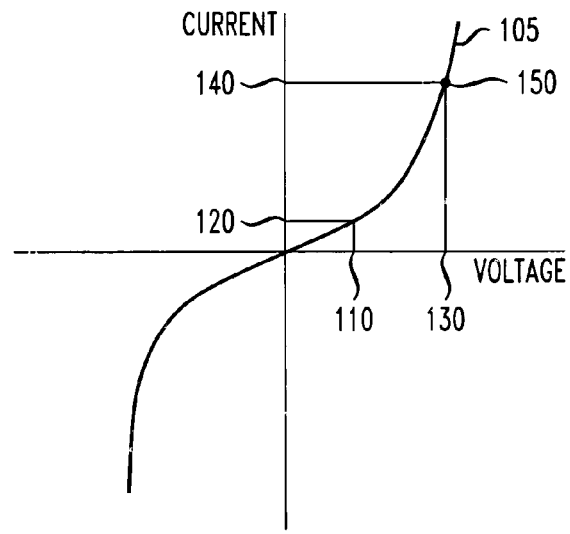
FIG. 1 is an exemplary current-voltage graph for a conventional magnetic tunnel junction, illustrating current leakage problems with conventional MRAMs for partially selected MRAM cells.

Referring now to FIG. 1, an exemplary current-voltage graph is shown for a conventional magnetic tunnel junction. A magnetic tunnel junction comprises an important part of an MRAM cell. Current-voltage curve 105 is an exemplary curve used to point out certain characteristics of conventional MRAM cells, but this figure should not be construed to be an exact current-voltage curve for an MRAM cell. FIG. 1 illustrates current leakage problems with conventional MRAMs for partially selected MRAM cells. As described in more detail below in reference to FIGS. 2 and 3, when a selected MRAM cell is read, the partially selected cells on the same bit line as the selected cell will have a small amount of voltage across the partially selected cells. This small amount of voltage causes leakage current through the partially selected cells. For instance, a magnetic tunnel junction of a selected cell might have a voltage 130 across the magnetic tunnel junction. The selected cell will have a correspondingly relatively high amount of current flow through the magnetic tunnel junction of the selected cell, as indicated by current 140. The point 150 defined by voltage 130 and current 140 is called an "operating point" herein. The operating point is generally determined by a circuit designer based on speed and power requirements.

A partially selected cell will have a small amount of voltage across the magnetic tunnel junction of the cell, as indicated by voltage 110. This small voltage 110 causes a small amount of current 120 through the magnetic tunnel junction of the partially selected cell. This current 120, while relatively small, is effectively multiplied by the number of partially selected cells. Conventional read cycles of an MRAM will select one cell on a bit line and the other cells on the bit line will be partially selected. For large MRAMs, there could be a large number of partially selected cells that have leakage current (e.g., current 120). As described above, this leakage current results in higher power and slower speeds. The leakage current can be substantial enough to limit the attainable size of the MRAM.

Figure 2:
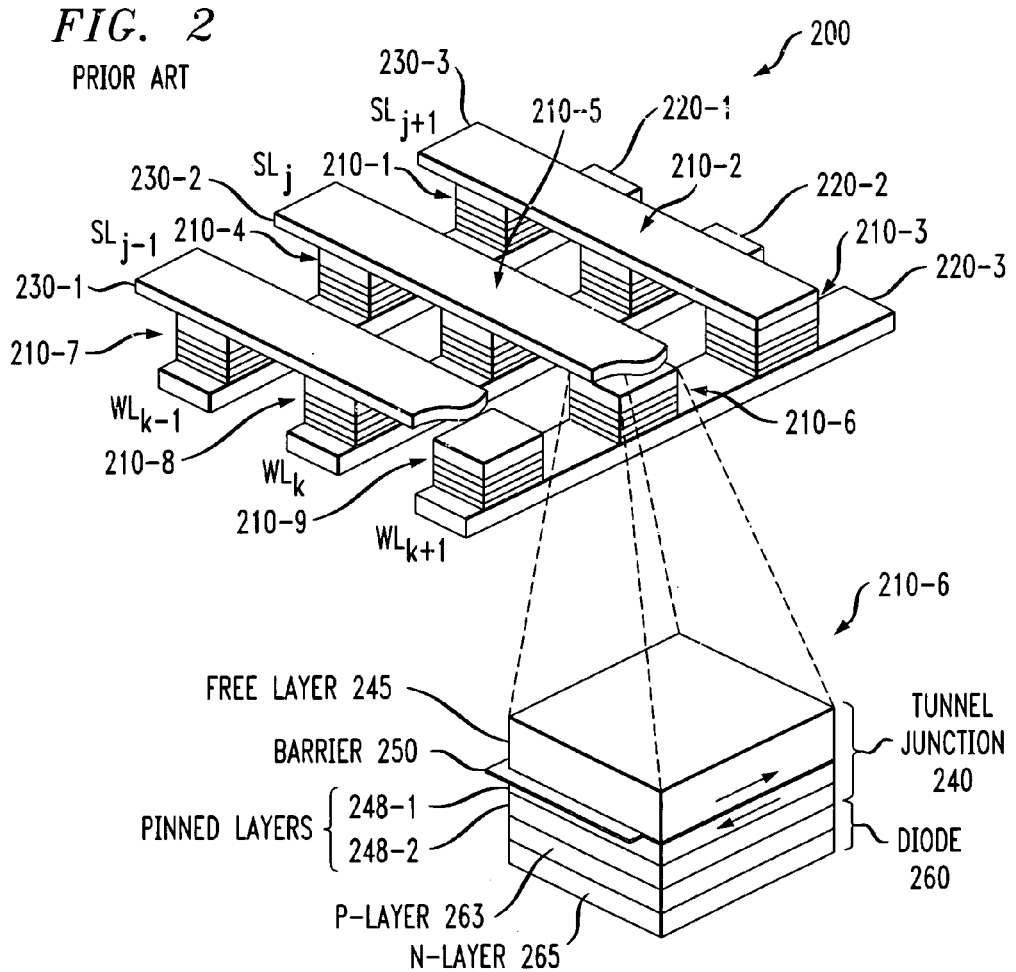
FIG. 2 is a three-dimensional view of a portion of an MRAM, illustrating one conventional technique for minimizing leakage current of partially selected MRAM cells and techniques for reading MRAM cells.
Figure 3:
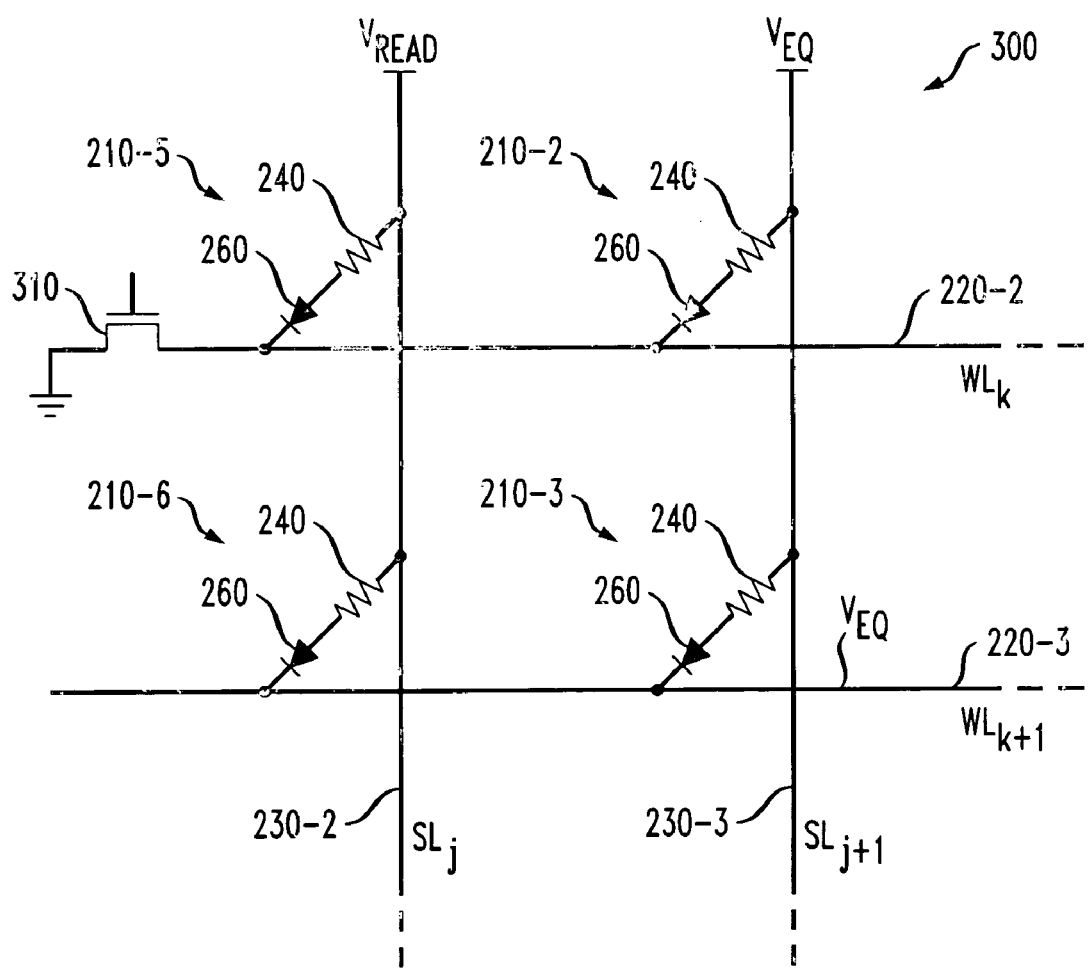
FIG. 3 is a circuit diagram equivalent of part of the MRAM portion shown in FIG. 2.
Figure 4:
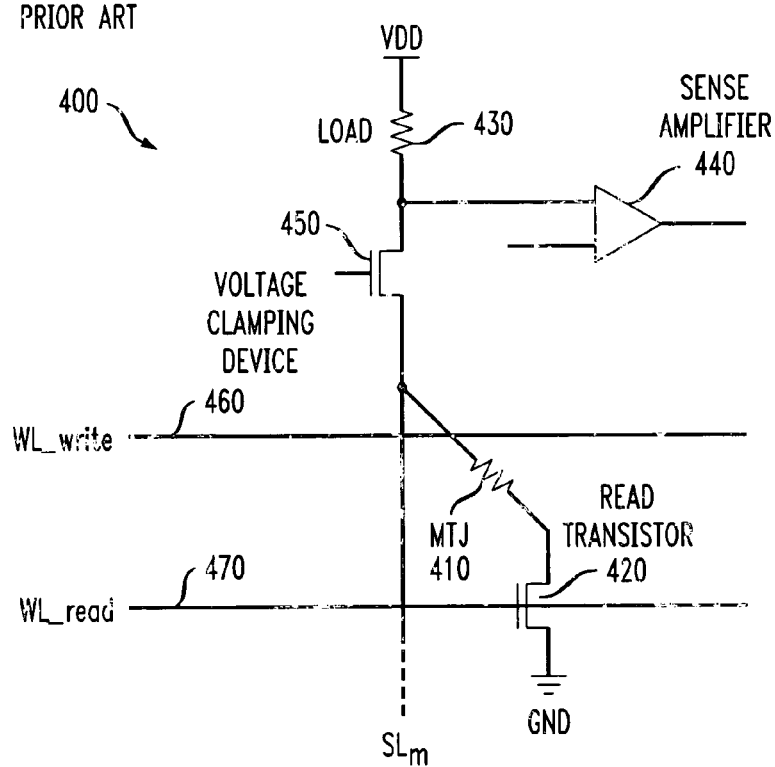
FIG. 4 is a circuit diagram of a single MRAM cell and associated devices for reading the MRAM cell, illustrating another conventional technique for minimizing leakage current of partially selected MRAM cells.

Thus, it is beneficial to reduce the leakage current through partially selected MRAM cells. FIGS. 2 through 4 illustrate two conventional techniques used to reduce the leakage current through partially selected MRAM cells, but at the expense of increased manufacturing complexity and cost, and decreased MRAM cell density.

FIG. 2 is a three-dimensional view of a portion 200 of a conventional MRAM, used to illustrate one conventional technique for minimizing leakage current of the partially selected MRAM cells and to illustrate techniques for reading MRAM cells. In this example, an entire MRAM or a section thereof has m bit lines, of which three are shown in FIG. 2, and n word lines, of which three are shown in FIG. 2. MRAM portion 200 comprises the following: three bit lines 230-1 through 230-3 (collectively, "bit lines 230"), which are marked as $SL_{j-1}$ through $SL_{j+1}$, respectively; three word lines 220-1 through 220-3 (collectively, "word lines 220"), which are marked as $WL_{k-1}$ through $WL_{k+1}$, respectively; and nine MRAM cells 210-1 through 210-9, which are formed between the bit lines 230 and word lines 220. A single cell, 210-6 is also shown in FIG. 2. Cell 210-6 comprises a magnetic tunnel junction 240 and a diode 260. Magnetic tunnel junction 240 comprises a free layer 245, a barrier 250, and two pinned layers 248-1 and 248-2. Diode 260 comprises p-layer 263 and n-layer 265.

As shown in the diagram of 210-6, a pinned layer 248-1 is pinned to a particular magnetization. The free layer 245 also has a magnetization. These magnetizations are shown by the arrows in FIG. 2. As shown in FIG. 2, the magnetizations of the free layer 245 and the pinned layer 248-1 are opposite. Generally, this means that the resistance, as measured by forcing a current from a bit line 210 to a word line 220 (or vice versa), of the magnetic tunnel junction 240 increases, although this depends on the materials used and other variables. When the magnetizations of the free layer 245 and the pinned layer 248-1 point the same way, then the resistance, as measured by forcing a current from a bit line 210 to a word line 220 (or vice versa), generally decreases. Thus, a change in resistance when the free layer 245 changes magnetizations. This change in resistance can be measured in a number of different ways, as is known in the art. In particular, Gallagher et at., "Magnetic Memory Array Using Magnetic Tunnel Junction Devices in the Memory Cells, U.S. Pat. No. 5,640,343 (1997), the disclosure of which is hereby incorporated by reference, describes techniques for reading and writing to MRAM cells.

During a read of selected MRAM cell 210-5, the bit line 230-2 is held at $V_{read}$ and selected word line 220-2 is held at ground. Bit lines 230-1 and 230-3 are held at $V_{eq}$, as are the word lines 220-1 and 220-3. Partially selected cells 210-4 and 210-6 have some voltage across them because bit line 203-2 is held at $V_{read}$ while word lines 220-1 and 220-3 are held at $V_{eq}$. Thus, non-selected MRAM cells 210-1 through 210-3 and 210-7 through 210-9 have approximately zero volts across them, partially selected MRAM cells 210-4 and 210-6 have a voltage across them equivalent to $V_{read}-V_{eq}$, and selected MRAM cell 210-5 has a voltage across it equivalent to $V_{read}$. Therefore, there are (n−1) partially selected MRAM cells 210 that have a voltage across them equivalent to $V_{read}-V_{eq}$. For larger MRAMs, where n is large, leakage current can be quite problematic.

Many conventional MRAM designs do not contain diode 260 and, instead, solely have magnetic tunnel junction 240 as part of each MRAM cell. During the read process for an MRAM without diodes 260 in each MRAM cell, $V_{read}$ is usually close to $V_{eq}$ and can be generally written as $V_{eq}+dV$. There are primarily two types of sensing techniques used to read information from MRAM cells 210, of which only current sensing is described herein. In current sensing, dV is an error voltage. All the non-selected MRAM cells 210 have no voltage across them and thus have no leakage current. All the partially selected MRAM cells 210 along the bit line 230-2 have $dV=(V_{read}-V_{eq})$ across them and cause a leakage current of $i_{leakage}=i(dV) \times (n-1)$. The selected MRAM cell 210-5 has $V_{read}$ across it and has a signal current of $i_{sig}=i(V_{read}) \sim i(V_{eq})$. The signal-to-leakage ratio is then the following: $i_{sig}/i_{leakage}=i(V_{eq})/\{i(dV) \times (n-1)\}$. For a conventional magnetic tunnel junction, $i(V_{eq})/i(dV)$ is comparable to $V_{eq}/dV$, and the signal-to-leakage current can be quite high when the number of cells on a bit line is high.

FIG. 2 also illustrates one way in which MRAM designers have attempted to reduce leakage current. In particular, diode 260 is added to each MRAM cell 210. Diode 260 will not conduct an appreciable amount of current until voltage across the diode 260 reaches a predetermined voltage. Generally, this predetermined voltage is greater than $V_{read}-V_{eq}$, which means that a partially selected MRAM cell 210 should conduct very little current when diode 260 is used in conjunction with magnetic tunnel junction 240. Leakage current through partially selected cells is therefore minimized.

Turning now to FIG. 3, a circuit diagram equivalent for a section 300 of the MRAM portion 200 shown in FIG. 2. In section 300, it can be seen that bit line 230-2 is held at $V_{read}$, word line 220-2 is connected to ground through transistor 310, and bit line 230-3 and word line 230-3 are held at $V_{eq}$. Each MRAM cell 210 is illustrated as a resistor, which corresponds to magnetic tunnel junction 240, and a diode, which corresponds to diode 260. During a read of MRAM cell 210-5, the resistance of the magnetic tunnel junction 240 depends, as described above, on the state of magnetizations of the free and pinned layers. The voltage across each of the (m−1) partially selected cells 210 on the bit line 230-2 is $V_{read} - V_{eq}$, which is a sufficiently small value to prevent the diode in the partially selected cells 210 from conducting. Meanwhile, the selected cell 210-5 has approximately $V_{read}$ across the cell, so the diode 260 in the cell 210-5 conducts current. During a read, it is possible to determine, through a variety of techniques known to those skilled in the art, what the state is for the magnetic tunnel junction 240 (illustrated as a resistor) of the selected cell 210-5.

FIG. 4 illustrates another conventional circuit 400 used to reduce leakage current in partially selected MRAM cells. Circuit 400 is an illustration of reading devices and a single MRAM cell. Circuit 400 comprises a magnetic tunnel junction 410, read transistor 420, load 430, sense amplifier 440, and voltage clamping device 450. The load 430, sense amp 440, and voltage clamping device 450 are devices typically used to read MRAM cells. An MRAM cell comprises the magnetic tunnel junction 410 and the read transistor 420. Read transistor 420 is used to stop leakage current when the magnetic tunnel junction 410 is partially selected. However, the read transistor 420 requires that a second word line, word line 470, be used in addition to normal word line 460. The second word line 470 adds additional processing and area. Additionally, the read transistor 420 adds additional processing and generally a large amount of area. Thus, the benefit of lower leakage current for partially selected MRAM cells is mitigated by reduced MRAM cell density and increased processing complexity and cost.

The techniques of FIGS. 2 through 4 require additional processing steps and manufacturing costs. Moreover, the additional structures used to limit leakage current add physical size to the MRAMs, which reduces MRAM density and the ability to stack additional layers of MRAM or other devices onto an already existing MRAM layer.

The present invention overcomes these problems by providing MRAM cells having low leakage current yet having physical sizes similar to conventional magnetic tunnel junction sizes. The present invention discloses MRAMs where MRAM cells have barriers whose barrier height is selected to modify the non-linearity of the current-voltage characteristics of the magnetic tunnel junctions in the MRAM cells. Additionally, thickness of the barriers is selected based on current requirements, power requirements or both. Although the thickness of magnetic tunnel junctions made in accordance with the present invention may increase somewhat as compared to conventional magnetic tunnel junctions, this increase in thickness is markedly smaller than the thickness caused by a diode or the area required by a transistor.

Figure 5:
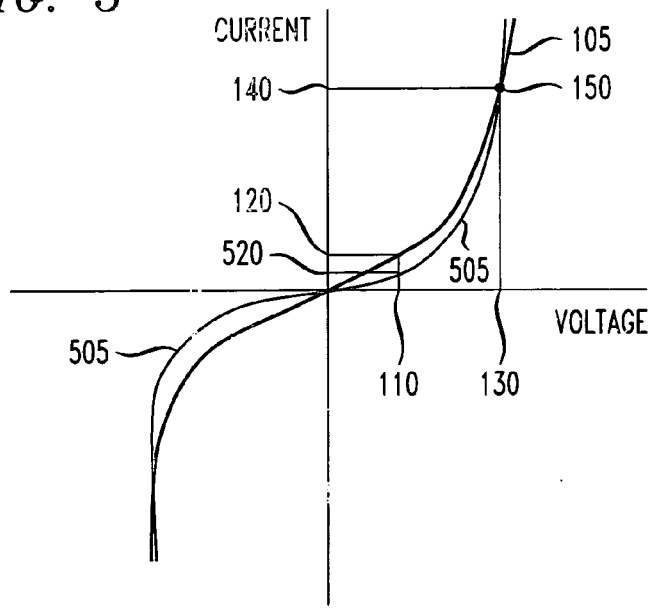
FIG. 5 is an exemplary current-voltage graph, comparing the leakage current of partially selected MRAM cells made in accordance with the present invention with conventional MRAM cells.

Turning now to FIG. 5, an exemplary current-voltage graph is shown. FIG. 5 compares the current leakage of MRAMs made in accordance with the present invention with conventional MRAMs. The current-voltage curve 105 is, as described above, an example of a possible current-voltage curve for a conventional MRAM. Current-voltage curve 505 is an example of a current-voltage curve for a magnetic tunnel junction made in accordance with the present invention. Current-voltage curve 505 points out differences between conventional magnetic tunnel junctions and magnetic tunnel junctions designed in accordance with the present invention, and the current-voltage curve 505 should not be construed to be an exact representation of a current-voltage curve for magnetic tunnel junctions produced using the present invention. At the voltage 110, a conventional magnetic tunnel junction will have a leakage current 120. However, because the present invention modifies the non-linearity of the current-voltage curve, a magnetic tunnel junction made in accordance with the present invention will have a leakage current, for instance, illustrated by reference 520. Thus, the leakage current for magnetic tunnel junctions designed in accordance with the present invention will be lower than that provided by a conventional magnetic tunnel junction.

In FIG. 5, the operating point 150 caused by voltage 130 across a conventional magnetic tunnel junction and a magnetic tunnel junction designed via the present invention is the same. Generally, once the material for the magnetic tunnel junction barrier is chosen so that the barrier height is fixed, the thickness of the barrier is modified to produce the current 140 required by a designer to meet speed and power requirements. In this example, the same current 140 is chosen for both selected magnetic tunnel junctions designed in accordance with the present invention and selected conventional magnetic tunnel junctions. However, current 140 can be modified, in accordance with the present invention, via thickness of the barrier such that the current 140 through a selected magnetic tunnel junction is different than that shown on FIG. 5. This is explained below.

Current through a magnetic tunnel junction is proportional to linear and nonlinear terms, where the nonlinear term is a function of the barrier height and the thickness of the barrier. The current-voltage relationship for a magnetic tunnel junction is the following, described in J. G. Simmons, J. Appl. Phys. 34, 1793 (1963), the disclosure of which is hereby incorporated by reference:

$$i = \beta V(1 + \alpha V^2),$$

where $\alpha$ is a nonlinear term, $\beta$ is a linear term, and both are terms that are not necessarily constant. For example, $\alpha$ is a function of the thickness, t, and the barrier height, $\phi$, of the barrier of a magnetic tunnel junction. Because $\alpha$ is a function of the thickness and the barrier height, then current is also a function of the thickness and barrier height. Additionally, the nonlinear term, $\alpha$, is related to thickness and barrier height via the following relationship:

$$\alpha \propto \frac{t}{\sqrt{\phi}},$$

which is also described in more detail in Simmons. The present invention advantageously uses the relationship between $\alpha$ and the thickness and barrier height in order to lower the leakage current of partially selected cells while still providing adequate current for selected cells. The nonlinear term $\alpha$ is modified by adjusting the barrier height and thickness of the barrier, thereby reducing leakage current while allowing a wide variety of operating points.

In particular, the present invention discloses magnetic tunnel junctions having barriers whose barrier heights are about 1.5 eV or less. The following is a list of materials used for barriers in a magnetic tunnel junction and barrier heights of these materials, as determined by certain researchers. With the exception of the last reference, all researchers reported successful magnetic tunnel junction devices.

| Barrier Material | Barrier Height, ϕ, eV | Reference | Year |
|---|---|---|---|
| ZnS | 0.58 | Guth et. al., APL 78 (22), 3487 | 2001 |
| TaO | 0.8–0.9 | Gillies et. al., APL 78 (22), 3496 | 2001 |
| MgO | 0.9–1.1 | Bowen et. al., APL 79, 1655 | 2001 |
| MgO | 0.9 | Kiyomura et. al., JAP 88, 4768 | 2000 |
| MgO | 0.9 | Moodera et. al., JAP 79, 4724 | 1996 |
| $HfO_2$ | 1.7 | Platt et. al., APL 69, 2291 | 1996 |
| $Al_2O_3$ | 1.2–2.1 | Sun et al., APL 74 (3), 448 | 1999 |
| $Al_2O_3$ | 2–3 | Moodera et al., APL 70 (22), 3050 | 1997 |
| $Al_2O_3$ | 1.8–2.5 | Sousa et al., APL 73 (22), 3288 | 1998 |
| $Al_2O_3$ | 2.6 | McBride et al., JAP 45, 2305 | 1974 |

In the table shown above, "APL" is the Applied Physics Letter, while "JAP" is the Journal of Applied Physics. Each of these references is hereby incorporated by reference. It should be noted that, in the above references, the materials were used to determine whether a magnetic tunnel junction could be made.

Materials such as ZnS, TaO, or MgO are suitable, due to the relatively low barrier height of these materials, for use to enhance, in accordance with the present invention, the non-linearity of a magnetic tunnel junction. The lower limit for the barrier height is also important. If a barrier height is too low, then current will flow through a magnetic tunnel junction because of thermal energy imparted to electrons. Therefore, it is recommended that the barrier height be much greater than thermal energy, kT, where k is the Boltzmann constant and T is temperature in Kelvin. At typical operating temperatures, the thermal energy ranges from 20–30 meV (millielectron volts).

Enhanced nonlinear magnetic tunnel junctions made by using the techniques of the present invention will have an improved signal-to-leakage ratio. As described above, for the conventional magnetic tunnel junction with a relatively thin barrier with relatively high barrier height, $i(V_{eq})/i(dV)$ is comparable to $V_{eq}/dV$. The enhanced nonlinear magnetic tunnel junctions of the present invention, when used in MRAMs, cause $i(V_{eq})/i(dV)$ to be much greater than $V_{eq}/dV$. This means that the signal-to-leakage ratio of the following:

$$i_{sig}/i_{leakage} = i(V_{eq})/[i(dV) \times (n-1)] = V_{eq}/dV \times (1+\alpha V_{eq}^2)/(1+\alpha dV^2)/(n-1),$$

is improved because the term $i(V_{eq})/i(dV)$ is improved as compared to conventional magnetic tunnel junctions used in MRAMs. This improvement in signal-to-leakage comes with no extra processing steps or cell area as compared to conventional magnetic tunnel junctions without diodes or other leakage-current-limiting devices. Additionally, the present invention provides only a generally minor increase in barrier thickness.

Figure 6:
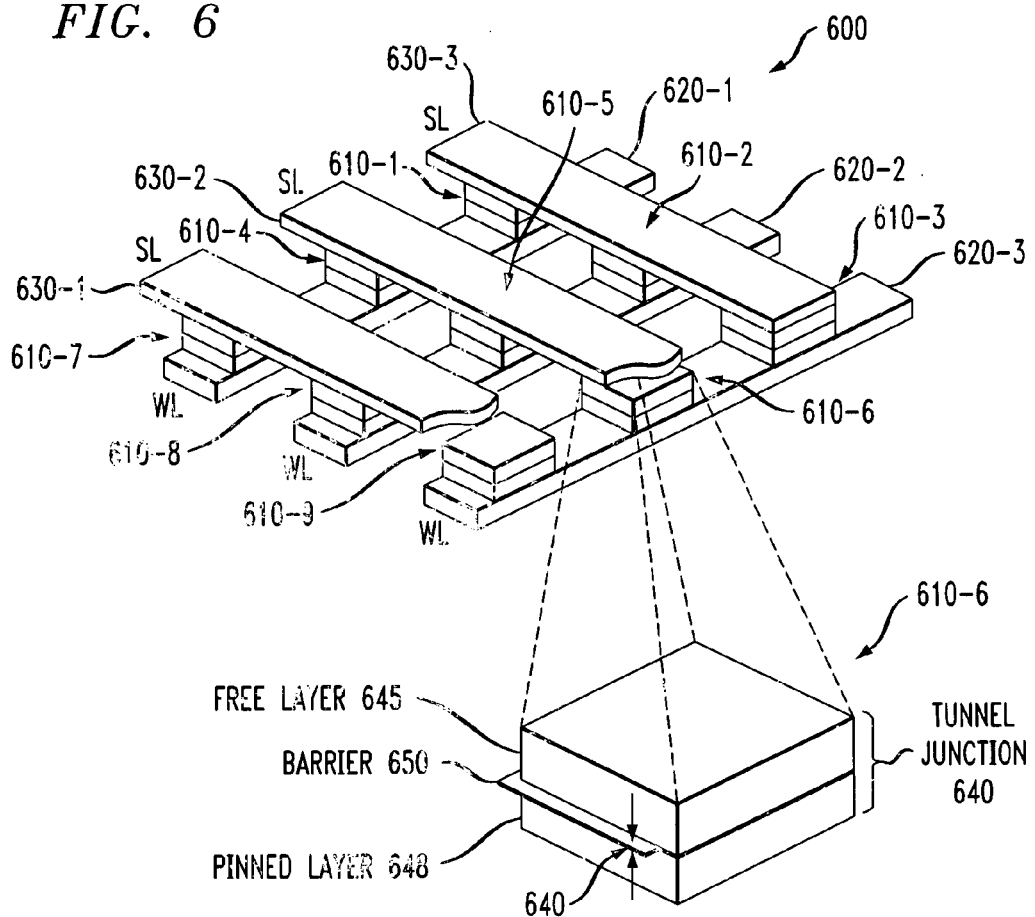
FIG. 6 is an illustration of a portion of an MRAM made in accordance with the present invention.

Turning now to FIG. 6, an illustration is shown of a portion 600 of an MRAM made in accordance with the present invention. In this example, an entire MRAM or a section thereof has m bit lines, of which three are shown in FIG. 6, and n word lines, of which three are shown in FIG. 6. MRAM portion 200 comprises the following: three bit lines 630-1 through 630-3 (collectively, "bit lines 630"), which are marked as $SL_{j-1}$ through $SL_{j+1}$, respectively; three word lines 620-1 through 620-3 (collectively, "word lines 620"), which are marked as $WL_{k-1}$ through $WL_{k+1}$, respectively; and nine MRAM cells 610-1 through 610-9, which are formed between the bit lines 630 and word lines 620. A single cell, 610-6 is also shown in FIG. 6. Cell 610-6 comprises a magnetic tunnel junction 640, which comprises a free layer 645, a barrier 650, and a pinned layer 648.

Each of the cells 610 comprise a barrier 650 having a barrier height of 1.5 eV or less. Because the barrier height is lower than in conventional magnetic tunnel junctions used in MRAM cells, the thickness 690 of the barrier 650 may be changed, as compared to conventional magnetic tunnel junctions, in order to create the desired current flow through the magnetic tunnel junction 640. Generally, once the material for the barrier 650 is selected, the designer can select an appropriate thickness 690 for the barrier 650 in order to create a desired current, based on speed and power constraints.

Although word lines 620 are shown underneath and bit lines 630 are shown on top of the MRAM cells 610, this formation is purely exemplary. For instance, bit lines 630 could be placed underneath and word lines 620 on top of the MRAM cells 610. Additionally, the free layer 645 or pinned layer 648 may each comprise multiple layers. There may also be one or more interface layers for each of the free layer 645 or pinned layer 648.

Figure 7:
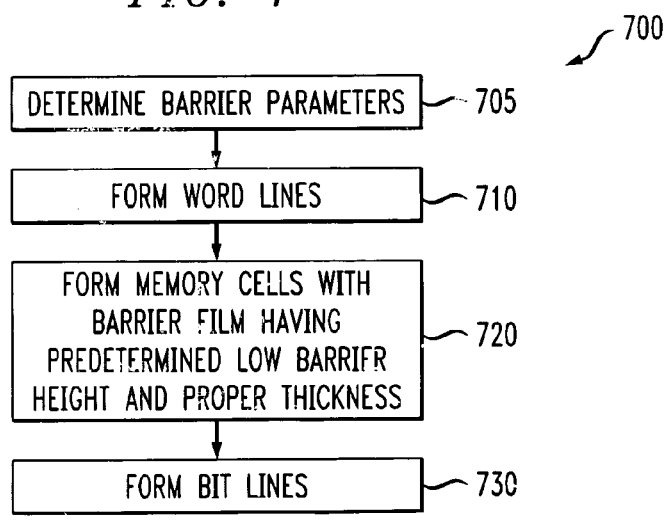
FIG. 7 is a flowchart of a method for forming an MRAM or a portion thereof, in accordance with one embodiment of the present invention.

Turning now to FIG. 7, a flowchart is shown of a method 700 for forming an MRAM or a portion thereof, in accordance with one embodiment of the present invention. Method 700 begins in step 705, when the barrier parameters are determined. As described above, the present invention forms MRAMs with magnetic tunnel junctions having relatively low barrier height and potentially greater thickness, as compared to conventional magnetic tunnel junctions used in MRAMs. A designer, in step 705, selects a suitable barrier material having a relatively low barrier height, preferably a barrier height of around 1.5 eV or less. The designer also has other criteria, such as speed and power consumption, both of which are related to current through selected and partially selected MRAM cells. Based on these criteria, the designer can select a suitable barrier thickness for the selected material in order to produce the required current at the operating point and the leakage current for partially selected cells. Additionally, it is also possible that a designer begin by selecting a predetermined low leakage current, determining the barrier height and potentially an initial estimate of the thickness for the barrier in order to provide the predetermined low leakage current. The designer can then select an appropriate material having approximately the barrier height. The actual barrier height for the selected material can then be used in new calculations.

In step 710, the word lines are formed. In step 720, MRAM cells are formed, where the MRAM cells have barriers with a predetermined low barrier height, preferably around 1.5 eV or less. In step 730, bit lines are formed. Steps 710 through 730 are performed through techniques known to those skilled in the art.

It should be noted that method 700 can be iterated. In particular, MRAM cells using the method 700 can be formed and then tested to determine an actual operating point and actual leakage current. If the operating point and leakage current are different than that calculated, adjustments may be made to the processes used, barrier material and thickness, or other variables.

It is to be understood that the embodiments and variations shown and described herein are merely illustrative of the principles of this invention and that various modifications may be implemented by those skilled in the art without departing from the scope and spirit of the invention.

What is claimed is:

1. A method of forming a magnetic random access memory having a plurality of word lines and bit lines comprising the step of:

forming a plurality of memory cells coupled to the bit lines and word lines, at least one of the memory cells comprising a barrier film formed between two magnetic layers, wherein the barrier film has a barrier height of about 1.5 electron volt (eV) or less and wherein said barrier film and a barrier thickness are selected based on a desired current to enhance a non-linearity of a tunnel junction.

2. The method of claim 1, wherein the barrier film consists essentially of magnesium oxide.

3. The method of claim 1, wherein the barrier film consists essentially of tantalum oxide.

4. The method of claim 1, wherein the barrier film consists essentially of zinc sulfide.

5. The method of claim 1, wherein the barrier film comprises magnesium oxide.

6. The method of claim 1, wherein the barrier film comprises tantalum oxide.

7. The method of claim 1, wherein the barrier film comprises zinc sulfide.

8. The method of claim 1, further comprising the step of forming the barrier film to a predetermined thickness.

9. The method of claim 8, further comprising the step of determining the predetermined thickness based on one or more of speed and power requirements for the magnetic random access memory.

10. The method of claim 8, further comprising the steps of selecting the barrier height and the thickness of the barrier film in order to meet both an operating point for selected cells and leakage current through non-selected cells.

11. The method of claim 1, further comprising the steps of determining the barrier height based on a desired leakage current for partially selected cells in the magnetic random access memory, and selecting a material having approximately the determined barrier height.

12. A magnetic random access memory (MRAM) having a plurality of word lines and a plurality of bit lines, the MRAM comprising:

a plurality of memory cells coupled to the bit lines and word lines, at least one of the memory cells comprising a barrier film formed between two magnetic layers, wherein the barrier film has a barrier height of about 1.5 electron volt (eV) or less and wherein said barrier film and a barrier thickness are selected based on a desired current to enhance a non-linearity of a tunnel junction.

13. The MRAM of claim 12, wherein the barrier film consists essentially of magnesium oxide.

14. The MRAM of claim 12, wherein the barrier film consists essentially of tantalum oxide.

15. The MRAM of claim 12, wherein the barrier film consists essentially of zinc sulfide.

16. The MRAM of claim 12, wherein the barrier film comprises magnesium oxide.

17. The MRAM of claim 12, wherein the barrier film comprises tantalum oxide.

18. The MRAM of claim 12, wherein the barrier film comprises zinc sulfide.

19. The MRAM of claim 12, wherein the barrier film is formed to a predetermined thickness, the predetermined thickness based on one or more of speed and power requirements for the magnetic random access memory.

20. The MRAM of claim 12, wherein said desired current is selected based on speed and power requirements.

21. The MRAM of claim 12, wherein said desired current is selected based on operating point and leakage current requirements.

22. The method of claim 1, wherein said desired current is selected based on speed and power requirements.

23. The method of claim 1, wherein said desired current is selected based on operating point and leakage current requirements.

* * * * *